(12) United States Patent
Miyata

(10) Patent No.: US 12,525,477 B2
(45) Date of Patent: Jan. 13, 2026

(54) SUBSTRATE STORAGE CONTAINER

(71) Applicant: Shin-Etsu Polymer Co., Ltd., Tokyo (JP)

(72) Inventor: Haruka Miyata, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 18/840,425

(22) PCT Filed: Jan. 20, 2023

(86) PCT No.: PCT/JP2023/001636
§ 371 (c)(1),
(2) Date: Aug. 21, 2024

(87) PCT Pub. No.: WO2023/162529
PCT Pub. Date: Aug. 31, 2023

(65) Prior Publication Data
US 2025/0167026 A1    May 22, 2025

(30) Foreign Application Priority Data

Feb. 25, 2022 (JP) ................. 2022-027840

(51) Int. Cl.
*H01L 21/673* (2006.01)
(52) U.S. Cl.
CPC .............. *H01L 21/67373* (2013.01)
(58) Field of Classification Search
CPC ............ H01L 21/673; H01L 21/67369; H01L 21/67386; H01L 21/67383; B65D 85/30; B65D 55/022
(Continued)

(56) References Cited

U.S. PATENT DOCUMENTS 6,105,782 A    8/2000 Fujimori et al.
6,622,883 B1 *    9/2003 Wu .................. H01L 21/67373
                                                    220/323
(Continued)

FOREIGN PATENT DOCUMENTS

JP    2000-058633 A       2/2000
JP    2003133405 A  *    5/2003
(Continued)

OTHER PUBLICATIONS

International Search Report issued in PCT/JP2023/001636 on Apr. 4, 2023 (4 pages).
(Continued)

*Primary Examiner* — Chun Hoi Cheung
(74) *Attorney, Agent, or Firm* — Osha Bergman Watanabe & Burton LLP

(57) ABSTRACT

Provided is a substrate storage container that can make locking mechanisms metal-free, also make locking claws of the locking mechanisms operate smoothly and ensure sufficient sealing performance of the lid. A locking claw 40 is comprised of a locking block 41 that can move linearly in an inside-outside direction of the lid body while being held between a pair of locking mechanism guide blocks of a lid 10 and can swing in a thickness direction of the lid body, joint bars 44 that are joined to an advancing/retracting bar 34 of a locking mechanism 30, and cam bosses 46 that are fitted into cam grooves 17 of the locking mechanism guide blocks. The locking block 41, the joint bars 44 and the cam bosses 46 are formed integrally from a molding material containing resin. A depressed portion is formed in the locking block 41, and a resin pin 49 is supported between both side ends of the depressed portion with a resin pressing roller 50 fitted on the resin pin 49. The cam boss has a pair of flat facets 47 formed on its peripheral surface. The cam groove 17 is formed of divided sections including: a straight linear-motion groove (Continued)

19 that is in contact with the flat facets 47 to limit the swing of the locking claw 40; and an arcuate swinging-motion groove to allow the locking claw 40 to swing.

8 Claims, 18 Drawing Sheets

(58) Field of Classification Search
USPC .......................................... 206/710–712, 832
See application file for complete search history.

(56) References Cited

U.S. PATENT DOCUMENTS

| | | | |
|---|---|---|---|
| 7,549,552 B2* | 6/2009 | Hasegawa | H01L 21/67373 220/323 |
| 7,828,341 B2* | 11/2010 | Hasegawa | H01L 21/67373 70/120 |
| 11,398,395 B2* | 7/2022 | Smith | H01L 21/67373 |
| 12,009,242 B2* | 6/2024 | Hsu | H01L 21/67389 |
| 12,243,762 B2* | 3/2025 | Chiu | E05B 65/523 |
| 2016/0163575 A1* | 6/2016 | Phark | H01L 21/67373 206/710 |
| 2025/0167026 A1* | 5/2025 | Miyata | B65D 85/30 |

FOREIGN PATENT DOCUMENTS

| | | |
|---|---|---|
| JP | 2017-130548 A | 7/2017 |
| JP | 2021-028936 A | 2/2021 |
| JP | 7634453 B2 * | 2/2025 |

OTHER PUBLICATIONS

Written Opinion of the International Searching Authority issued in PCT/JP2023/001636 on Apr. 4, 2023 (3 pages).

* cited by examiner

SUBSTRATE STORAGE CONTAINER

TECHNICAL FIELD

The present invention relates to a substrate storage container used in semiconductor factories of a mini-environment type to transport and store semiconductor wafers, and more specifically to an improvement in a locking mechanism for locking a lid.

BACKGROUND TECHNOLOGY

In semiconductor factories, a substrate storage container called a FOUP (Front Opening Unified Pod) is used to transport and store semiconductor wafers having a diameter of 300 mm, and this substrate storage container includes, as partially shown in FIG. 19, a container body 1 for accommodating a plurality of semiconductor wafers, a lid fitted to an open front 2 of the container body 1, and a pair of locking mechanisms for locking the lid fitted to the front 2 of the container body 1. The pair of locking mechanisms are built in the lid, and the paired locking mechanisms are operated by a lid opening/closing device standardized by SEMI standards (see Patent Documents 1, 2, and 3).

The lid has a substantially box shape that is removably fitted to the open front 2 of the container body 1, and is formed with a required number of passage openings for the paired locking mechanisms perforated in the peripheral wall of the lid and is equipped with an endless seal gasket fitted to the peripheral edge of the rear side of the lid. The endless seal gasket deforms as the lid is pressed against the inner circumference of the front of the container body. Each of the locking mechanisms includes: an operating reel supported by the lid and turned externally by a key operation of the lid opening/closing device; a pair of advancing/retracting bars 34A that vertically move in and out by the rotation of each operating reel; and a pair of swingable locking claws 40A that project out from respective passage openings of the lid and become engaged into locking pockets 4 on the inner circumference of the front of the container body 1 as each advancing/retracting bar 34A advances.

Each locking claw 40A has a substantially inverted T-shaped cross-section with its rear side of the lower part swingingly supported by the distal end part of the advancing/retracting bar 34A via a coupling pin 60 and the front side of the lower part swingingly supported inside the lid near the passage opening via a support pin 61 while a press roller 50A that slides into the locking pocket 4 on the inner circumference of the front of the container body 1 is rotatably supported via a roller pin 62 at the distal end of the locking claw. The coupling pin 60, the support pin 61 and the roller pin 62, for example, are SUS pins of 1.0 mm in diameter and excellent in strength.

In the above configuration, when the lid is fitted and locked to the open front 2 of the container body 1, the lid opening/closing device fits the lid into the open front 2 of the container body 1 and turns the operating reel of each locking mechanism a predetermined angle by means of the operation key of the lid opening/closing device. As a result, with the rotation of the operating reel each advancing/retracting bar 34A advances toward the peripheral wall of the lid. With the advancement of the advancing/retracting bars 34A, each locking claw 40A comes out through the passage opening from the interior of the lid to the exterior of the lid in a swinging manner while the thus projected locking claw 40A becomes engaged into the locking pocket of the container body 1. This engagement of the locking claw 40A draws the engaged lid to the front 2 of the container body 1 and locks the lid.

On the other hand, when the lid is unlocked and removed from the front 2 of the container body 1, the operation key of the lid opening/closing device rotates the operating reel of each locking mechanism to the original reference position. Then, as the operating reel turns back, each advancing/retracting bar 34A that has been out, returns to their original reference position in the lid. As the advancing/retracting bars 34A returns to the original position, each projected locking claw 40A returns swingingly through the passage opening from the locking pocket 4 of the container body 1 into the lid. As the locking claws 40A return swingingly, the lid fitted to the front 2 of the container body 1 becomes removable and is removed from the front 2 of the container body 1 by being pulled out by the lid opening/closing device.

Incidentally, in recent years, from the point of view of eliminating diverse adverse effects on the semiconductor wafers stored in the container body 1, the locking mechanism for substrate storage containers is desired to be metal-free, or not to use metal materials. In this view point, use of resin pins is being investigated instead of SUS pins for the coupling pin 60, support pin 61 and roller pin 62 of the locking claw 40A.

PRIOR ART DOCUMENTS

Patent Documents

Patent Document 1:
 Japanese Patent Application Laid-open No. 2000-058633
Patent Document 2:
 Japanese Patent Application Laid-open No. 2021-028936
Patent Document 3:
 Japanese Patent Application Laid-open No. 2017-130548

SUMMARY OF THE INVENTION

Problem to be Solved by the Invention

However, instead of the use of SUS pins, simple use of resin pins of the same diameter as that of SUS pins will not ensure sufficient strength and durability, so that there is a risk of the resin pins becoming eccentric and breaking. One way to eliminate this concern is to make the resin pins greater in diameter. However, when this method is adopted, the pressing roller 50A of the locking claw 40A will also become thicker, which gives rise to another problem that the projected locking claw 40A becomes difficult to return.

As the way to solve this problem, there is a method of shifting the center of swing of the locking claw 40A in the thickness direction of the lid or in the interior and exterior directions (in the vertical direction in FIG. 19). However, when this method is adopted, the locking claw 40A will not become sufficiently engaged with the locking pocket 4 of the container body 1, so that appropriate deformation of the sealing gasket of the lid cannot be expected. As a result, the sealing performance of the lid deteriorates, leading to contamination of the semiconductor wafers inside the container body, giving rise to a new significant problem, i.e., degradation of the semiconductor wafers.

The present invention has been devised in view of the above, it is therefore an object of the present invention to provide a substrate storage container that can realize a metal-free configuration for locking mechanisms, also make locking claws of the locking mechanisms operate smoothly and ensure sufficient sealing performance of the lid.

Means to Solve the Problem

In order to solve the above problems, the present invention, a substrate storage container comprises:
a lid that is fitted to an opening portion of container body capable of storing substrates; and
a locking mechanism that locks the fitted lid, wherein the lid comprises:
a lid body that is fitted to the opening portion of the container body; and
a plurality of locking mechanism guide members attached to the lid body,
wherein
a peripheral part of the lid body is formed with a plurality of passage openings capable of facing to locking pockets on an inner circumference of the opening portion of the container body, and
the plurality of locking mechanism guide members are arranged opposite to each other with each of opposite surfaces formed with a cam groove,
the locking mechanism comprises:
a plurality of advancing/retracting members that move in an inside-outside direction of the lid body as an operating member supported on the lid body of the lid is turned; and
a plurality of locking claws which protrude from the passage openings of the lid body fit into the locking pockets of the container body when the advancing/retracting members are advanced, and return from the locking pockets of the container body into the passage openings of the lid body when the advancing/retracting members are retracted,
the locking claw comprises:
a locking block that can move linearly (move straight) in the inside-outside direction of the lid body while being held between the plurality of locking mechanism guide members of the lid, and can swing (move swingingly) in a thickness direction of the lid body;
a plurality of joint bars that stick out of the locking block, and are joined to the advancing/retracting member of the locking mechanism; and
a plurality of cam protrusions that stick out from the locking block, and are fitted into the cam grooves of the plurality of locking mechanism guide blocks,
wherein
the locking block, the plural joint bars and the plurality of cam protrusions are formed integrally from a molding material containing a predetermined resin,
a resin pin is supported between the both sides of a depressed portion formed in the locking block,
a resin roller is fitted on the resin pin so as to come into contact with an interior of the locking pocket of the container body, and
a peripheral surface of the cam protrusion has a plurality of flat facets formed a predetermined interval apart from each other, and
the cam groove of the locking mechanism guide member is formed of divided sections including:
a straight linear-motion groove that is in contact with the plurality of flat facets of the cam protrusion of the locking claw to limit a swing of the locking claw; and
an arcuate swinging-motion groove formed wide at one end of the straight linear-motion groove to permit the swing of the locking claw.

Here, the container body can be formed to be a front open box capable of accommodating a plurality of semiconductor wafers so as to enable the lid to be removably fitted to the opened front,
the plurality of locking mechanism guide members are attached in a vicinity of the peripheral part of the lid body of the lid, and
the locking mechanism guide member that, among the plurality of locking mechanism guide members, is located close to a lateral side of the lid body, is integrated with a door guide.

Further, the cam protrusion of the locking claw can be adapted to be located in a vicinity of an extension line extended from an inner surface of a front wall that defines the locking pocket of the container body when the locking mechanism locks the lid fitted to the front of the container body and draws the lid into the container body.

In addition, the lid body of the lid may be formed with a pair of mounting sections for mounting locking mechanisms on both sides on a front surface of the lid body, and is formed with a cover plate for covering the locking mechanism of the lid body,
the advancing/retracting member for the locking mechanism is bent in a thickness direction of the lid, and
the advancing/retracting member is formed with a reinforcing rib formed on at least one of a front surface and a rear surface of the advancing/retracting member.

Furthermore, it is preferable that a plurality of joint claws having a semicircular arc cross-section are formed on both sides at a distal end part of the advancing/retracting member of the locking mechanism so that the plurality of joint claws and the plurality of joint bars of the locking claw are fitted together.

It is also preferable that the locking block comprises:
a plate part with a bulging distal end part and a curved back surface; and
a projection formed on the back surface of the plate part, and
the locking block is formed to have a substantially triangular shape when viewed from a lateral side, and
the joint bar sticks out from each lateral side of the projection so as to create a gap for the joint claws between the joint bar and the plate part.

Additionally, the plate part of the locking block may have a pair of cam protrusions which are protruded, in a vicinity of the joint bars, from both sides of a proximal end portion of the plate part, and
the plate part has the depressed portion formed in a distal end part of the plate part, and
the plate part has the resin pin supported between the two side ends of the depressed portion in a vicinity of the cam protrusions.

Further, it is preferable that the locking block, the plurality of joint bars, and the plurality of cam protrusions in the locking claw are integrally molded with a molding material containing at least one of polybutylene terephthalate resin and polyetheretherketone resin.

Furthermore, it is preferable that the resin pin and the resin roller in the locking claw are molded with a molding material containing at least one of polyetheretherketone resin and polybutylene terephthalate resin.

Moreover, it is preferable that in the cam groove a fitting start linear-motion groove into which the cam protrusion of the locking claw is fitted is formed contiguous to one end of the straight linear-motion groove, on an opposite side of the arcuate swinging-motion groove, and the plurality of flat facets of the cam projection are put in contact with the fitting start linear-motion groove to limit the swing of the locking claw.

Here, the substrates in the claims include at least semiconductor wafers, glass substrates, mask substrates and the like. When the substrates are semiconductor wafers, the semiconductor wafers include silicon wafers having a diameter of at least 300 mm or 450 mm. Further, the container body, and the lid body and the cover plate in the lid may be transparent, opaque, or translucent. These may be existing types or may have a novel structure.

Though the container body is mainly of a front open box type, it may also be of a top open box type. The vicinity of the extension line of the lock pocket of the container body includes both on the extension line and near the extension line. Moreover, though it is preferable that the locking mechanism guide member of the lid and the lid guide is formed in a one-body structure, they may be given separately. The term swinging of the locking claw should be understood practically and may include rotation and pivoting. Further, the substrate storage container according to the present invention may be a FOUP, or a FOSB for shipping, conforming to SEMI standards.

According to the present invention, the locking claw of the locking mechanism is made of resin to be metal-free, so the joint bar, cam protrusion, resin pin, and resin roller in the locking claw can be made thicker. Further, in addition to the swinging movement in the thickness direction of the lid body, the locking claw also makes linear movement in the inside-outside direction of the lid body, so that the protruded locking claw and resin roller can be smoothly returned to the passage opening. In addition, when the locking mechanism locks the lid, the locking claw does not simply swing to protrude in the thickness direction of the lid body, but moves linearly toward the interior of the locking pocket of the container body first and then swings, so that the locking claw can be fully fitted into the locking pocket regardless of the depth of the locking pocket.

Advantages of the Invention

The present invention has the advantages that it is possible to realize the metal-free of the locking mechanism, and it is possible to make the locking claw of the locking mechanism operate smoothly and assure sufficient sealing performance of the lid.

According to the invention recited in claim 2, since the locking mechanism can be made metal-free, it is possible to prevent contamination of the semiconductor wafers inside the container body and prevent deterioration of the semiconductor wafers. Further, since the locking mechanism guide member and the lid guide are not separated but are integrated, the number of parts can be reduced.

According to the invention recited in claim 3, when the locking mechanism locks the lid, since the cam protrusion of the locking claw fits inside the arcuate swinging-motion groove of the cam groove, and is located on the outer side inside the lid body at the contact point between the inner surface of the front wall that defines the locking pocket of the container body and the resin roller, the force acting in the left-right direction of the locking pocket can be easily transmitted. As a result, when the lid fitted to the front of the container body is drawn into the container body, the loss of drawing force can be reduced.

According to the invention recited in claim 4, it is possible to improve the strength and rigidity of the advancing/retracting member by the reinforcing rib.

According to the invention recited in claim 5, since the locking claw can be swingingly fitted and supported by the plurality of joint claws of the advancing/retracting member, there is no need to couple the distal end part of the advancing/retracting member and the joint claw with a separate metal pin, it is possible to expect the reduction of the number of parts.

According to the invention recited in claim 6, use of the gap between the plate part of the locking block and the joint bar facilitates the joint bar and the joint claw of the advancing/retracting member to be fitted together, and enables the joint claw to be more difficult to come off.

According to the invention recited in claim 7, since the joint bar of the locking block and the cam protrusion are located close to each other, and the cam protrusion and the resin pin also are located close to each other, it is possible to make the locking claw compact and reduce its operating range.

According to the invention recited in claim 8, use of the fitting start linear-motion groove in the cam groove facilitates the cam protrusion of the locking claw to be fitted into the cam groove, so that the locking mechanism guide member and the locking claw can be easily assembled.

EMBODIMENTS FOR CARRYING OUT THE INVENTION

Figure 1:
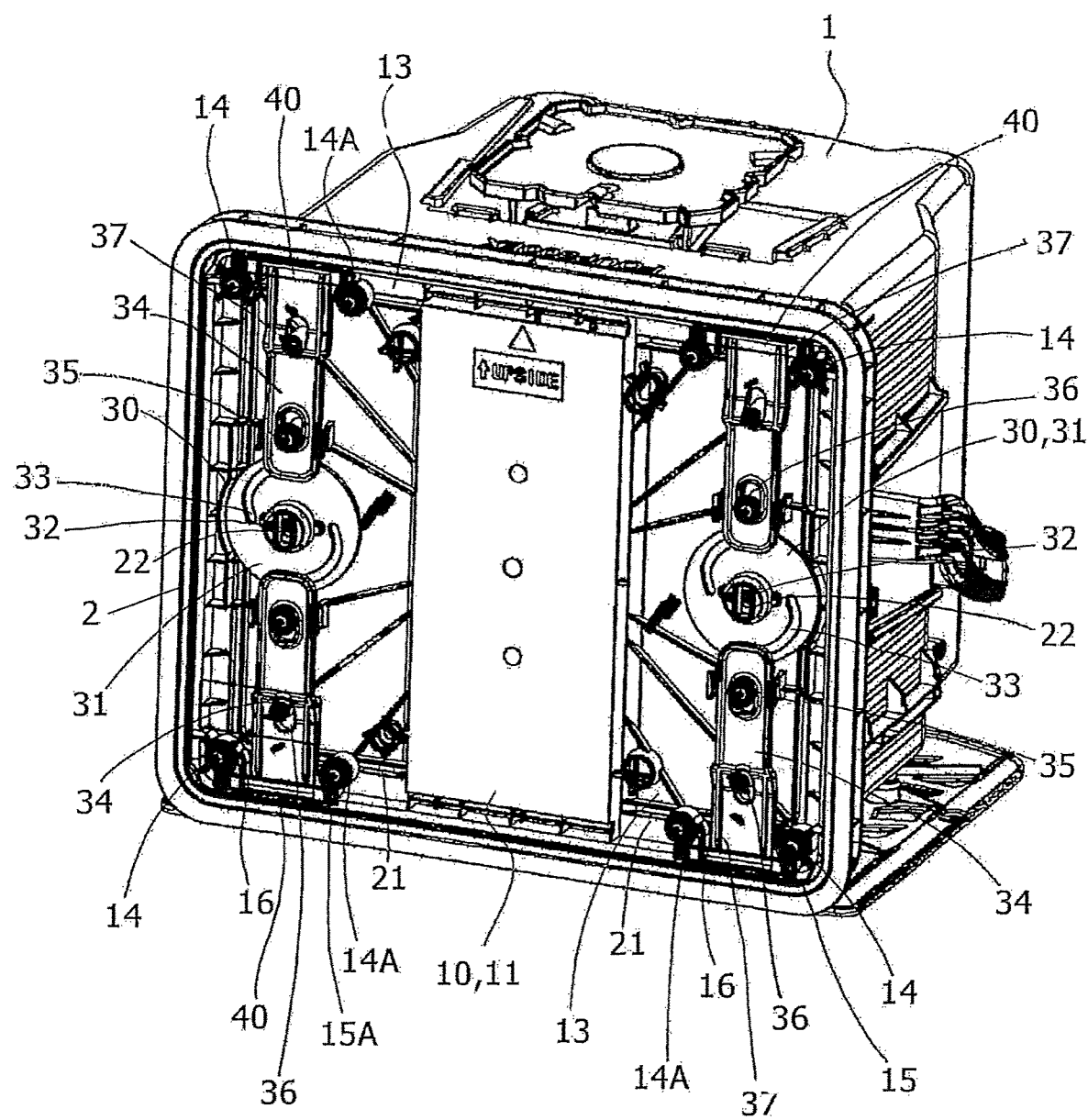
FIG. 1 An overall perspective illustration schematically showing an embodiment of a substrate storage container according to the present invention.

Hereinbelow, a preferred embodiment of the present invention will be described with reference to the drawings. As shown in FIGS. 1 to 18, a substrate storage container of this embodiment is a FOUP conforming to SEMI standards, including: a container body 1 capable of accommodating a plurality of semiconductor wafers in an array; an attachable and detachable lid 10 fitted to an open front 2 of the container body 1; and a pair of locking mechanisms 30 for locking the lid 10 that is fitted to the front 2 of the container body 1, in which locking claws 40 of each locking mechanism 30 are formed to be free from metals, and each locking claw 40 is configured to move linearly and swing to lock or unlock the lid. Thereby, this FOUP contributes to achieving Goal 9 of SDGs (the Sustainable Development Goals: the United Nations' international goals for sustainable development, consisting of 17 global goals and 169 targets (achievement criteria)) adopted at the United Nations Summit.

Although not shown, the semiconductor wafers are of thin, brittle, high-quality silicon wafers with a diameter of 300 mm, for example. This silicon wafer has a circular shape with its surface formed with circuit patterns. Twenty-five semiconductor wafers are accommodated inside the container body 1, and vertically arranged in array at predetermined intervals.

The container body 1 and the lid 10 are configured by assembling a plurality of parts each formed by injection molding of molding material containing appropriate resins. Examples of resins contained in the molding material include polycarbonate (PC) resin, cycloolefin polymer (COP) resin, cycloolefin copolymer (COC) resin, polypropylene (PP) resin, polyetherimide (PEI) resin, polyetherketone (PEK) resin, polyetheretherketone (PEEK) resin, polybutylene terephthalate (PBT) resin, polyacetal (POM) resin, liquid crystal polymer and other thermoplastic resins and alloys thereof.

Added as necessary to these resins are conductive materials such as carbon fibers, carbon powder, carbon nanotubes, conductive polymers and the like, and various antistatic agents such as anionic, cationic, and nonionic antistatic agents. Furthermore, benzotriazole-based, salicylate-based, cyanoacrylate-based, oxalic acid anilide-based, and hindered amine-based ultraviolet absorbers may be added, and glass fibers, carbon fibers, and the like that improve rigidity may be also added, selectively.

Figure 2:
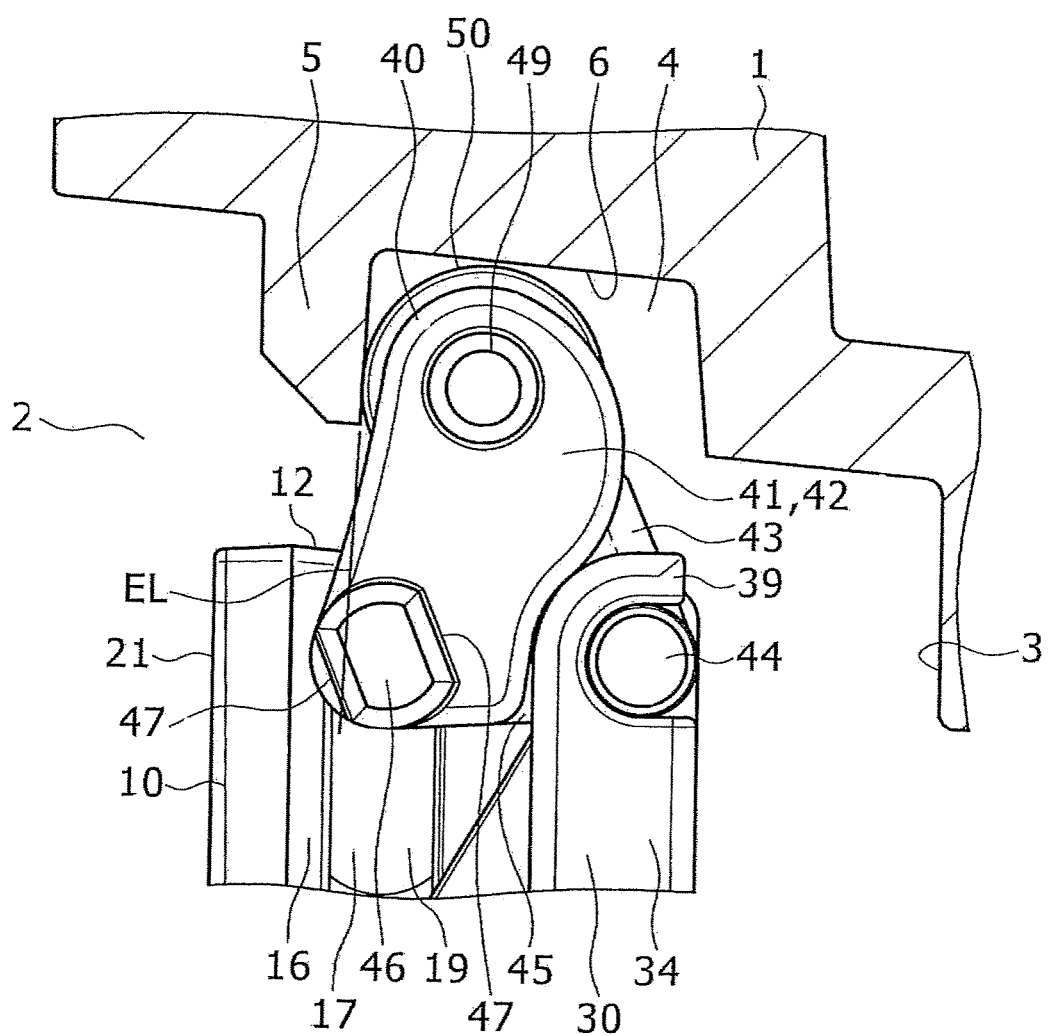
FIG. 2 A partial sectional illustration schematically showing the relationship between a locking pocket of the container body and a locking claw of a locking mechanism in the embodiment of the substrate storage container according to the present invention.
Figure 3:
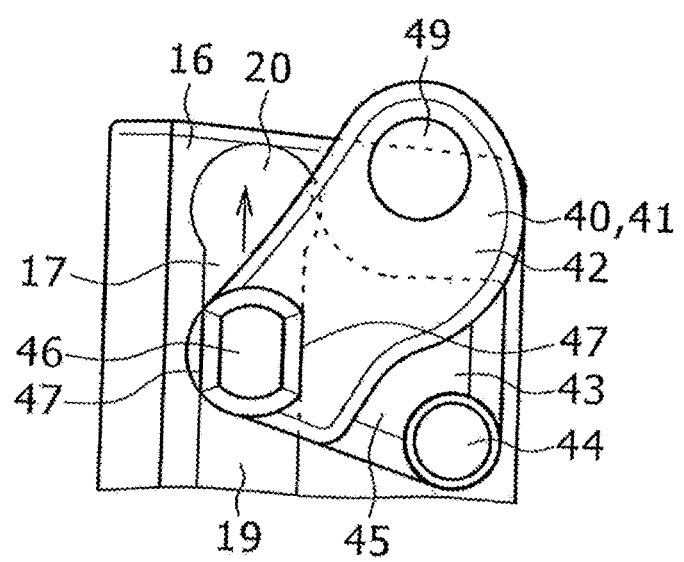
FIG. 3 An illustration schematically showing a state when the locking claw moves linearly in the embodiment of the substrate storage container according to the present invention.
Figure 4:
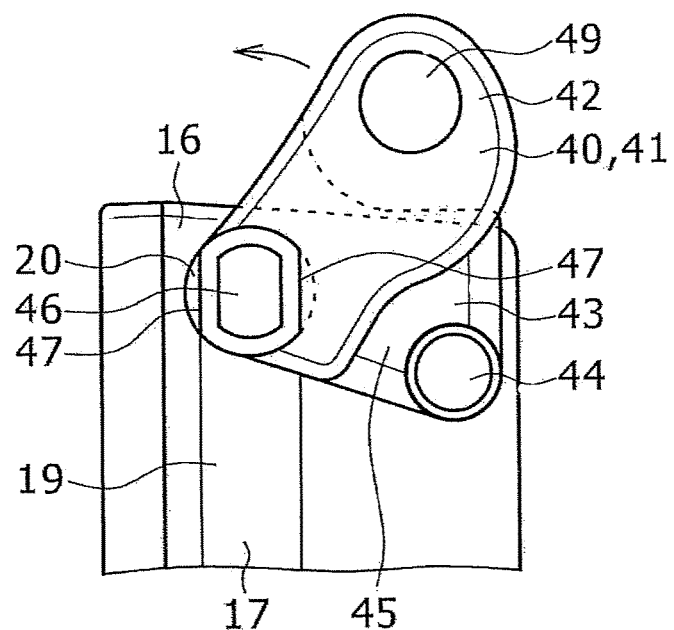
FIG. 4 An illustration schematically showing the state when the locking claw becomes swingable and just before swinging in the embodiment of the substrate storage container according to the present invention.
Figure 5:
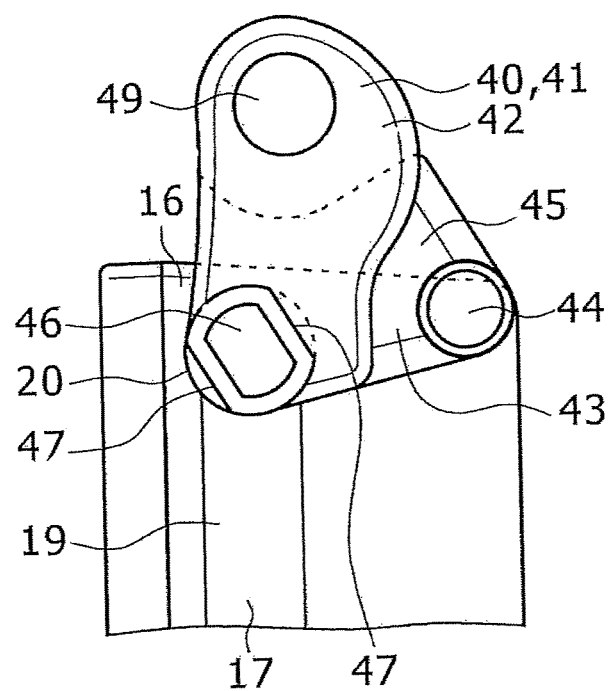
FIG. 5 An illustration schematically showing a state when the locking claw swings in the embodiment of the substrate storage container according to the present invention.

As shown in FIGS. 1 and 2, the container body 1 is formed by injection molding into a front open box having a laterally long open front 2. Formed on both the interior surfaces of the side walls are pairs of left and right teeth, which oppose each other and support semiconductor wafers horizontally, and are arranged vertically at predetermined intervals. Each of the teeth is formed in an elongated plate extending in the front-rear direction. The front 2 of the container body 1 is formed so that the brim thereof is extended laterally outwards via a step from the peripheral wall of the container body 1 while the flat shoulder surface of the step defines a sealing surface 3 for the lid 10. Substantially rectangular hollows are formed as locking pockets 4 for the locking mechanisms 30, at left and right positions on the upper and lower sides of the front inner circumference of the container body 1.

As shown in FIGS. 1, 2, 6, and 7, the lid 10 is an existing type composed of a lid body 11 that is attachably and removably fitted to the open front 2 of the container body 1 and has a substantially rectangular shape when viewed from the front; a plurality of locking mechanism guide blocks 16 disposed in the lid body 11; and a pair of cover plates 21 that cover the front surface (front side) of the lid body 11 and are exposed to the outside. A pair of locking mechanisms 30 are interposed between lid body 11 and the pair of cover plates 21.

The lid body 11 is formed into, for example, a shallow-bottomed substantially box-shaped in cross section (or substantially tray-shaped in cross section), and has passage openings 12 for locking mechanisms 30, bored therethrough at both the left and right positions on the upper and lower sides of the circumferential wall thereof, so as to oppose respective locking pockets 4 of the container body 1. The lid body 11 further has a vertically elongated front retainer of elastic pieces, the front retainer being attached on the middle section on the rear side of the lid body 11 so as to oppose the rear wall of the container body 1 and hold the front peripheral edges of the semiconductor wafers horizontally. Formed around the peripheral edge on the rear side of the lid body 11 is a frame-shaped fitting groove, into which a frame-shaped elastic deformable sealing gasket that comes into pressure contact with the sealing surface 3 of the container body 1 is fitted.

Figure 7:
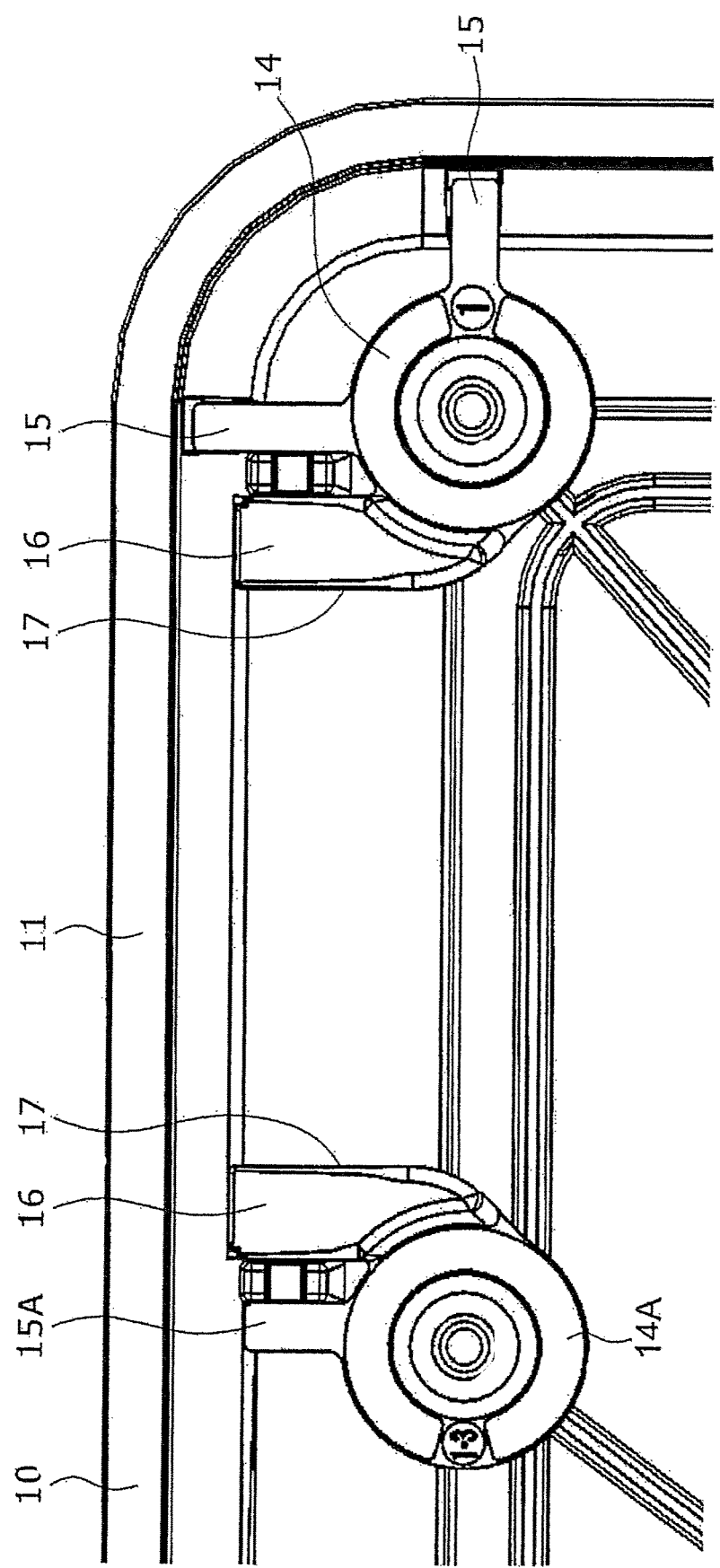
FIG. 7 A front view illustration schematically showing a lid's peripheral wall, a lid guide sleeve, and a rotation limiting sleeve of the lid in the embodiment of the substrate storage container according to the present invention.
Figure 8:
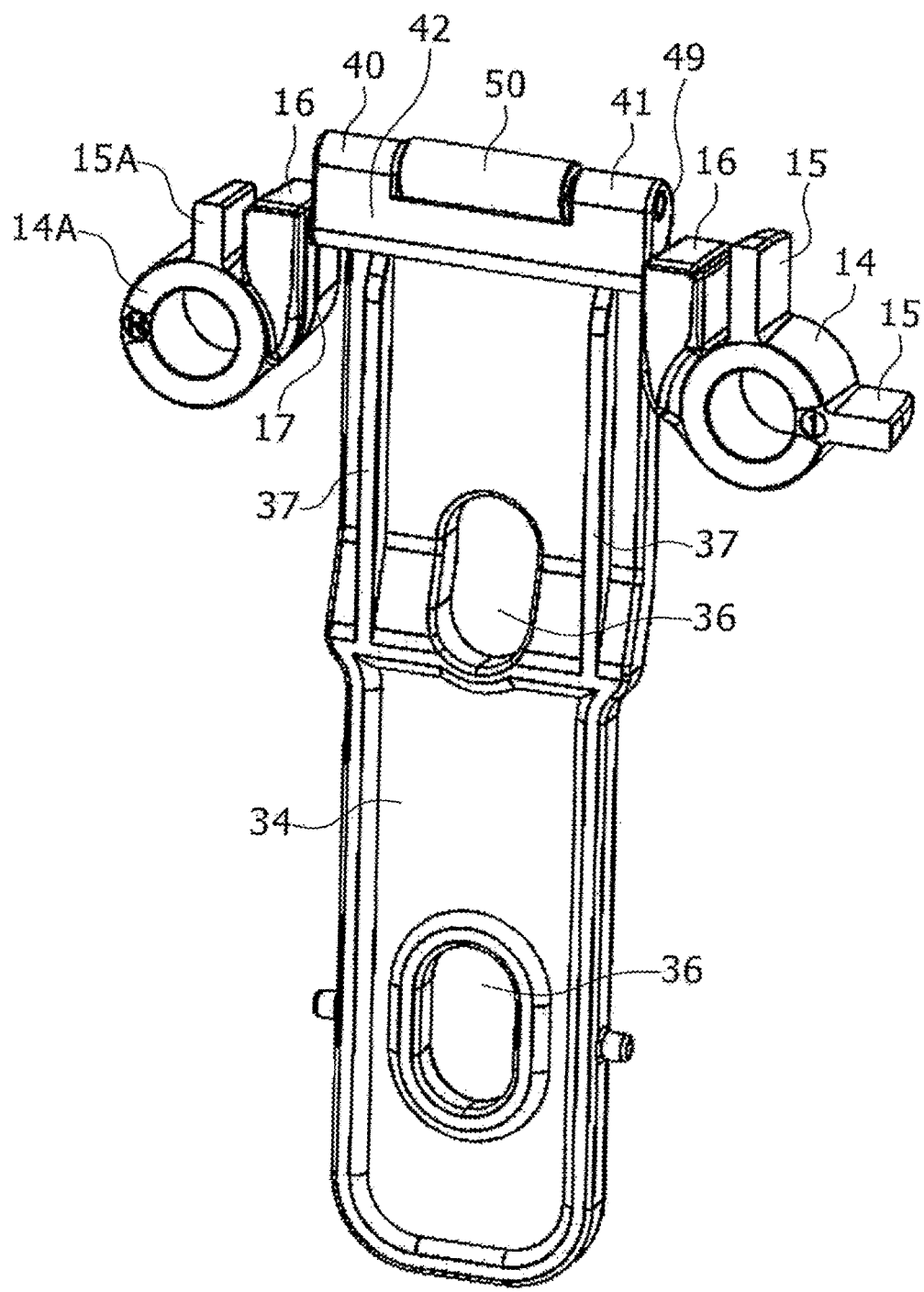
FIG. 8 A perspective illustration schematically showing an assembled state of an advancing/retracting bar of the locking mechanism and the locking claw in the embodiment of the substrate storage container according to the present invention.
Figure 9:
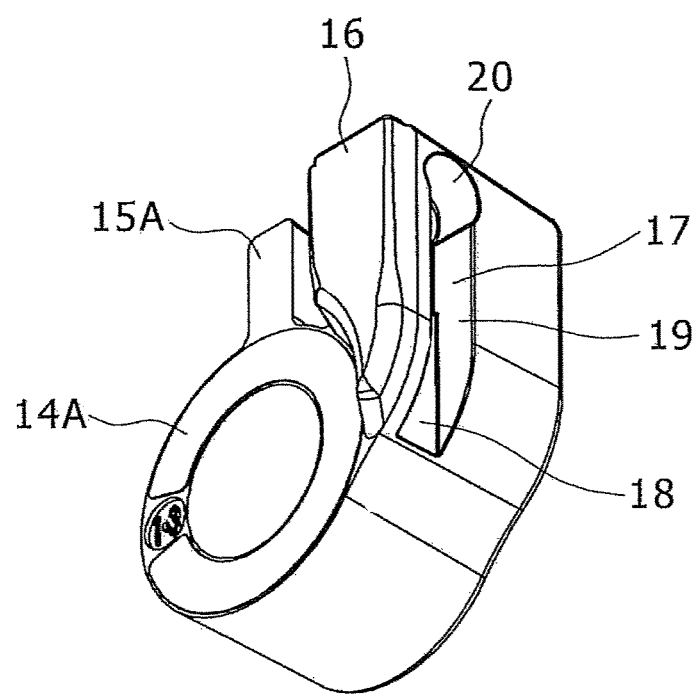
FIG. 9 A perspective illustration schematically showing a locking mechanism guide block and a rotation limiting sleeve in the embodiment of the substrate storage container according to the present invention.
Figure 10:
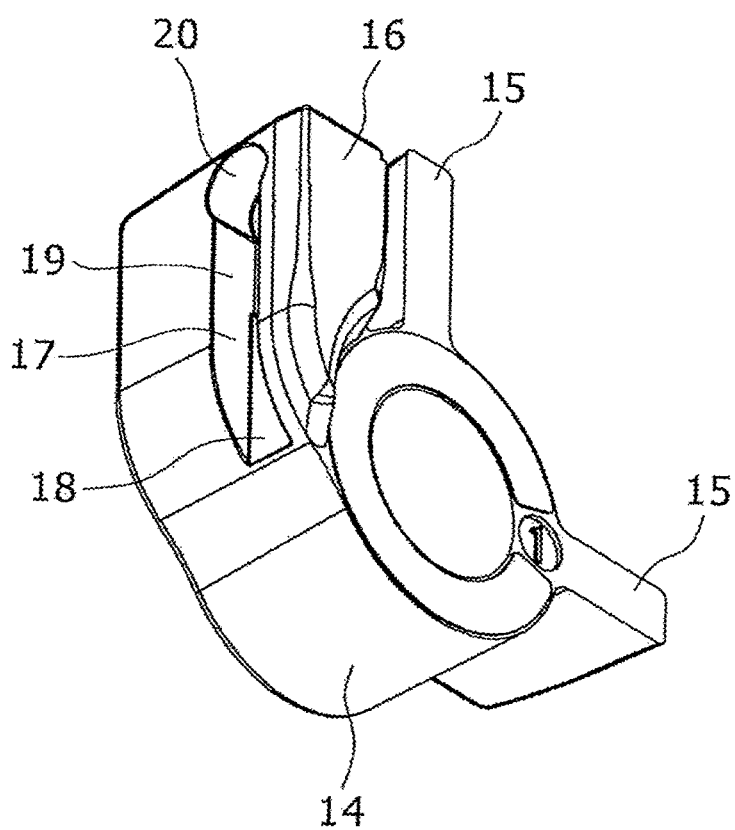
FIG. 10 A perspective illustration schematically showing the locking mechanism guide block and a lid guide in the embodiment of the substrate storage container according to the present invention.

The front surface of the lid body 11 is formed to be high in the center and low in both sides so as to define a pair of mounting sections 13 for locking mechanisms 30 on both sides of the front surface. Each mounting section 13 is formed in a vertically long rectangular shape and has a door guide sleeve 14 and a rotation limiting sleeve 14A arranged adjacent to both sides of the passage opening 12, respectively, on the upper and lower positions. As shown in FIGS. 7, 8, and 10, the door guide sleeve 14 is formed in a cylindrical shape with a bottom, and has a pair of plates 15 formed protruding from the outer peripheral surface with a gap of 90 degree to come into contact with the circumferential wall around the corner of the lid body 11. On the other hand, the rotation limiting sleeve 14A is formed in a cylindrical shape with a bottom, has a plate 15A formed protruding from the outer peripheral surface toward the upper or lower circumferential wall of the lid body 11, and is arranged so as to oppose from the inner side to the door guide sleeve 14 on the outer side with respect to the horizontal and lateral direction, as shown in FIGS. 7 to 9.

Figure 6:
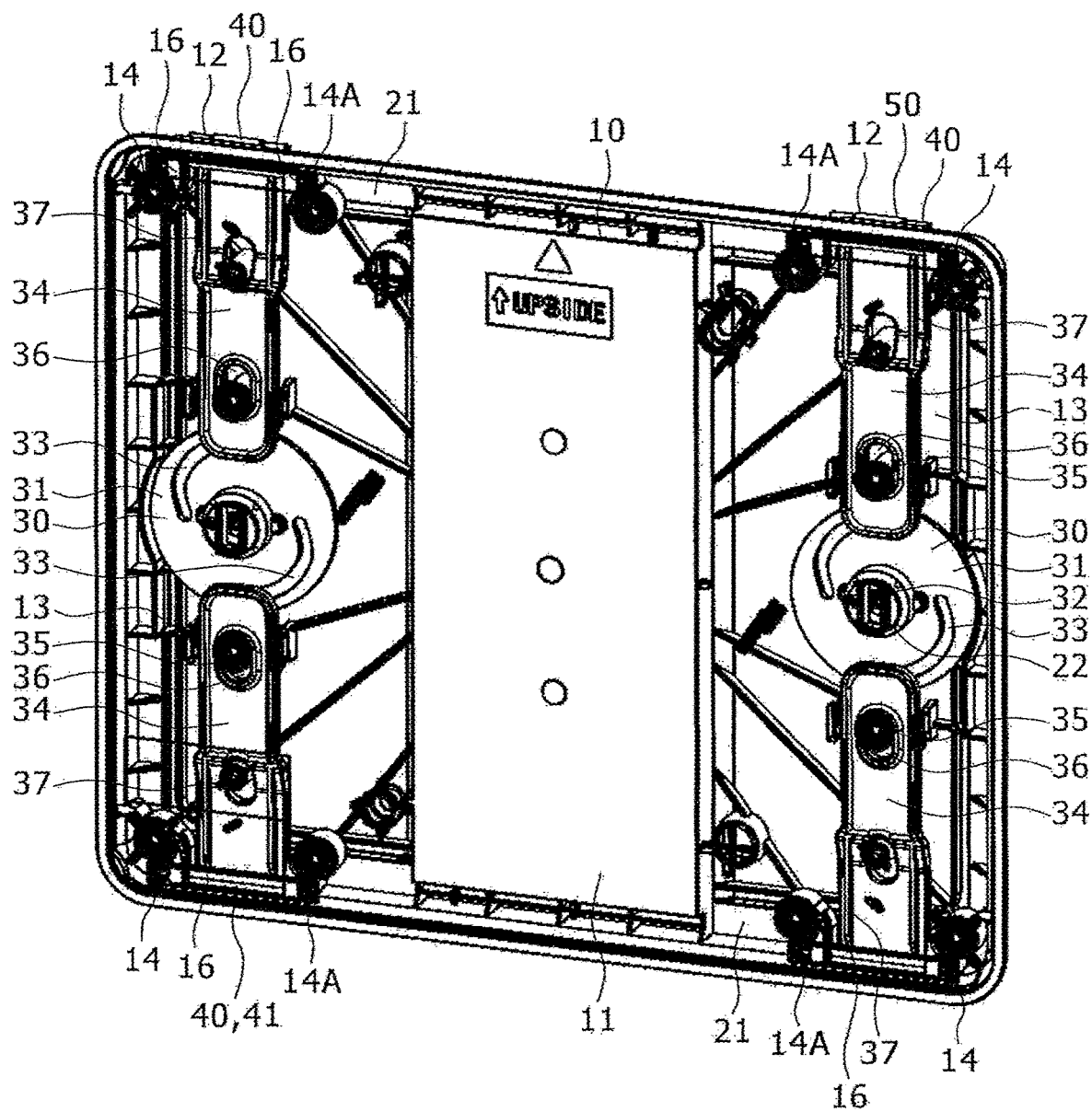
FIG. 6 A perspective illustration schematically showing a lid in the embodiment of the substrate storage container according to the present invention.
Figure 11:
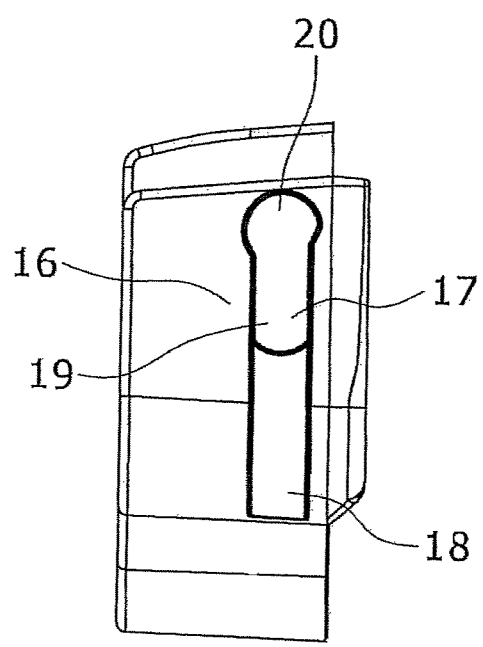
FIG. 11 An illustration schematically showing a cam groove of the locking mechanism guide block in the embodiment of the substrate storage container according to the present invention.

As shown in FIGS. 6 to 8, a plurality of locking mechanism guide blocks 16 are arranged at the upper and lower positions of each mounting section 13 and are each integrated with the door guide sleeve 14 or the rotation limiting sleeve 14A. A pair of locking mechanism guide blocks are opposed to each other in the left-right width direction of the lid body 11. As shown in FIGS. 9 to 11, the locking mechanism guide blocks 16 are each formed in a vertically long block and have a vertical cutout cam groove 17 for the locking mechanism 30 on the counter surface opposite to the adjacent locking mechanism guide block 16. The locking mechanism guide block is formed integrally with the peripheral side of the door guide sleeve 14 or the rotation limiting sleeve 14A, so that this configuration contributes to reducing the number of parts.

As shown in FIGS. 1 and 6, the pair of cover plates 21 function to cover the pair of mounting sections 13 of the lid body 11 and protect the locking mechanisms 30 from the outside. Each cover plate 21 is formed as a vertically long transparent plate, and is screwed onto a plurality of door guide sleeves 14 and rotation limiting sleeves 14A by fasteners. Bored near the center of the cover plate 21 is an operation hole 22 for the locking mechanism 30. This operation hole 22 enables the T-shaped operation key of the lid opening/closing device, standardized by SEMI standards, to pass therethrough, and as the operation key is turned a predetermined rotation angle, the locking mechanism 30 is operated to perform a locking or unlocking operation.

As shown in FIGS. 1, 2, 6, and 8, each locking mechanism 30 is installed in the mounting section 13 of the lid body 11, and includes: an operating reel 31 that is supported by the lid body 11 of the lid 10 and turned by an external key operation of the lid opening/closing device; a pair of top and bottom advancing/retracting bars 34 that move in an inside-outside and upward-downward direction of the lid body 11 as the operating reel 31 turns; and a pair of top and bottom locking claws 40 that project from the passage openings 12 of the lid body 11, and fit into and become engaged with the locking pockets 4 of the container body 1 as each advancing/retracting bar 34 advances and that return to the passage openings 12 of the lid body 11 from the locking pockets 4 of the container body 1 as each advancing/retracting bar 34 retracts.

The operating reel 31 and the pair of top and bottom advancing/retracting bars 34 in each locking mechanism 30 are injection molded with a molding material containing required resins. The required resins of the molding material are not particularly limited. Examples include: polyetheretherketone resin, which is excellent in heat resistance, incombustibility, abrasion resistance, mechanical properties, etc.; polybutylene terephthalate resin, which is excellent in heat resistance, abrasion resistance and durability; polycarbonate resin, which is excellent in impact resistance, heat resistance, dimensional stability, abrasion resistance, etc.; polyacetal resin, which is excellent in impact resistance, abrasion resistance, etc.; polyetherimide (PEI) resin, which is excellent in chemical resistance, water resistance, electrical properties, weather resistance, etc.; polyether sulfone (PES) resin, which is excellent in heat resistance, creep resistance, dimensional stability, incombustibility, etc.; polyphenylene sulfide (PPS) resin, which is excellent in chemical resistance, creep resistance, weather resistance, etc.; and polyamide-imide (PAI) resin, which is excellent in heat resistance, mechanical strength, etc., and alloys of these.

Among these resins, at least, polyetheretherketone resin or polybutylene terephthalate resin is preferred. Further, in addition to the required resins, lightweight carbon having excellent strength and rigidity, specifically, carbon nanotubes, carbon fibers, and the like, may be added to the molding material as necessary.

As shown in FIGS. 1 and 6, the operating reel 31 is given in a substantially convex-shaped disc form in which a reel lid 10 is attached to the center of the disc-shaped reel body via a rotary bearing, and is rotatably supported around the center of the mounting section 13 of the lid body 11. The operating reel 31's center portion 32 forming the reel lid projected toward the cover plate 21, is opposite the operation hole 22 of the cover plate 21. The operation key of the lid opening/closing device passes through the operation hole 22 and is inserted to turn the operating reel 31 automatically by a predetermined rotational angle. A pair of curved grooves 33 are bored 180° apart from each other near the peripheral edge of the operating reel 31 so that each curved groove 33 is formed in a semicircular arc shape. The proximal end of the advancing/retracting bar 34 is coupled with the curved groove 33.

As shown in FIGS. 1 and 6, the pair of top and bottom advancing/retracting bars 34 are arranged in the vertical direction of the operating reel 31, slidably along a plurality of guide ribs 35 in the mounting section 13 of the lid body 11. As shown in FIGS. 8, 12 to 14, each advancing/retracting bar 34 is given as a vertically long plate having a plurality of guide slots 36 and bent near the middle with respect to the thickness direction of the lid 10 or the lid body 11. The advancing/retracting bar 34 has a pair of reinforcing ribs 37 formed in an array on the rear side thereof so as to face the mounting section 13 in a non-contact manner and also has a pair of reinforcing ribs 37 formed in an array on the front side thereof so as to face the cover plate 21. Each reinforcing rib 37 is an elongated rib extending in the longitudinal direction of the advancing/retracting bar 34 and improves the strength of the advancing/retracting bar 34.

Figure 12:
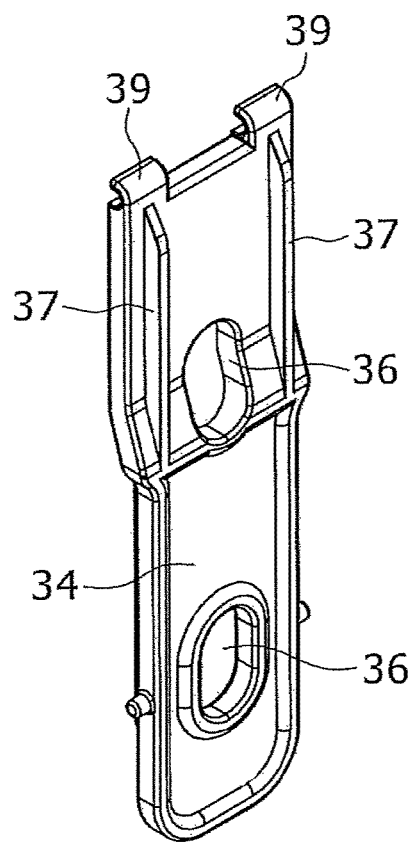
FIG. 12 A perspective illustration schematically showing the advancing/retracting bar in the embodiment of the substrate storage container according to the present invention.
Figure 13:
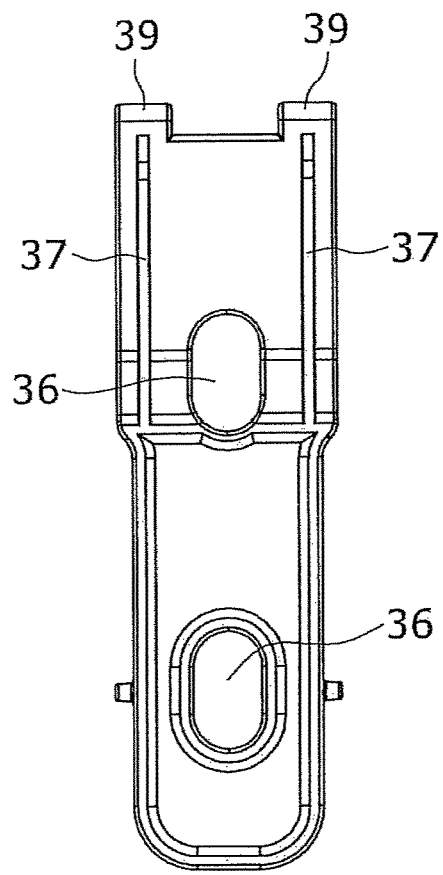
FIG. 13 A front view illustration schematically showing the advancing/retracting bar in the embodiment of the substrate storage container according to the present invention.
Figure 14:
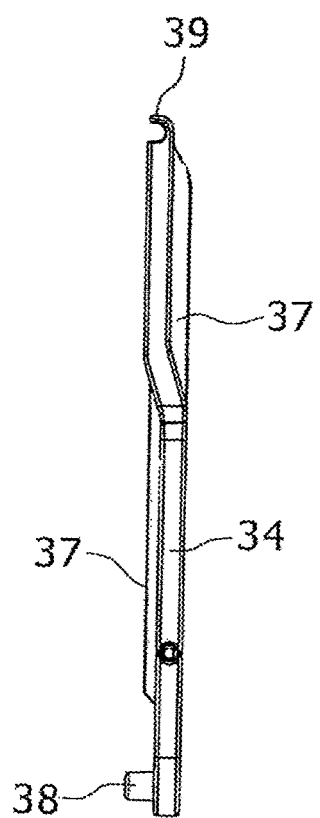
FIG. 14 A side view illustration schematically showing the advancing/retracting bar in the embodiment of the substrate storage container according to the present invention.
Figure 15:
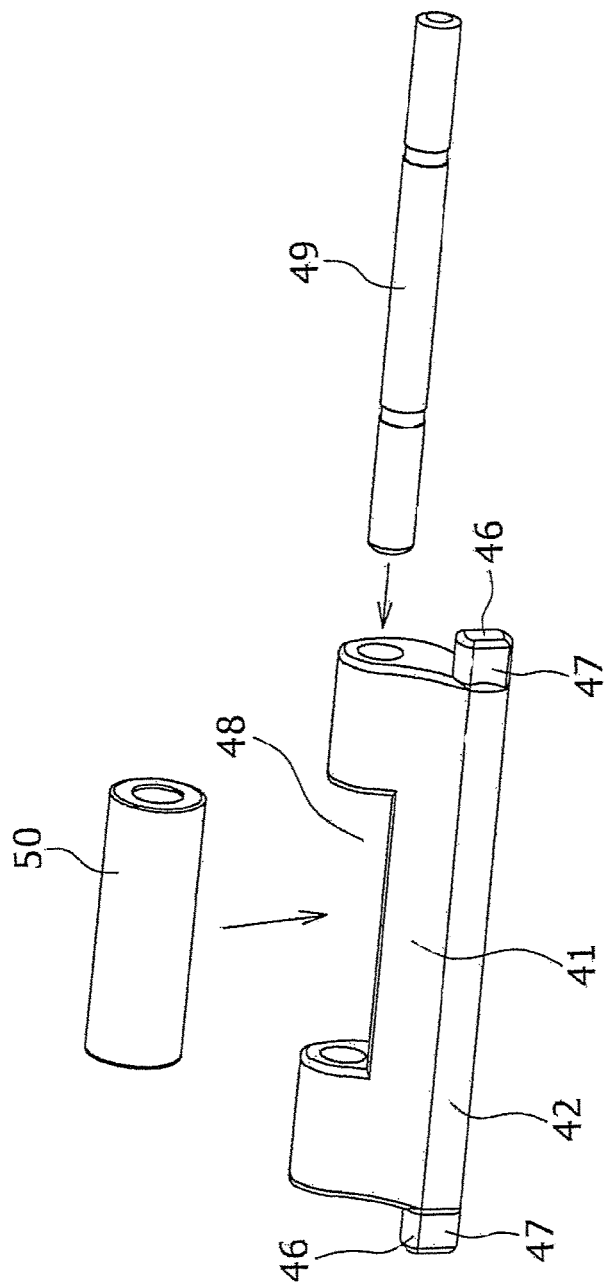
FIG. 15 An exploded perspective view schematically showing a locking block, a resin pin and a resin pressing roller in the embodiment of the substrate storage container according to the present invention.

As shown in FIG. 14, the advancing/retracting bar 34 has a cylindrical latch boss 38 integrally formed at the proximal end on the rear side thereof. The latch boss loosely fits in and can slide along the curved groove 33 of the operating reel 31. This loose fitting of the latch boss 38 allows the advancing/retracting bar 34 to advance and retract vertically in linkage with the rotation of the operating reel 31 while being guided along the guide ribs 35 in the mounting section 13. As shown in FIGS. 12 to 14, the advancing/retracting bar 34 also has a pair of joint claws 39 that are arranged on both sides of the distal end part of the advancing/retracting bar 34 to catch and support the locking claw 40 in a swingable manner. Each joint claw 39 has a thin-walled configuration that is approximately semicircular arc-shaped in cross-sectional view, or in other words, is curved in an approximately J character-shape.

As shown in FIGS. 8, 15 to 18, each locking claw 40 includes: a locking block 41 that is held between a pair of locking mechanism guide blocks 16 of the lid 10 and can vertically and linearly move in and out of the lid body 11 and can swing in the thickness direction of the lid 10 or the lid body 11; a pair of joint bars 44 that stick out from the locking block 41 and are joined to the advancing/retracting bar 34 of the locking mechanism 30; and a pair of cam bosses 46 that stick out from the locking block 41 and are fitted into the cam grooves 17 of the pair of locking mechanism guide blocks 16. The locking block 41, the paired joint bars 44 and the paired cam bosses 46 are formed integrally from a molding material containing a predetermined resin.

The molding material for the locking claw 40 is the same as that for the operating reel 31 and the advancing/retracting bar 34. From the viewpoint of putting a weight on wear resistance, the predetermined resin is preferably at least one of polybutylene terephthalate resin and polyetheretherketone resin. In addition to the predetermined resin, lightweight carbon having excellent strength, rigidity and the like, specifically, carbon nanotubes, carbon fibers, etc., may be added to the molding material as necessary.

Figure 16:
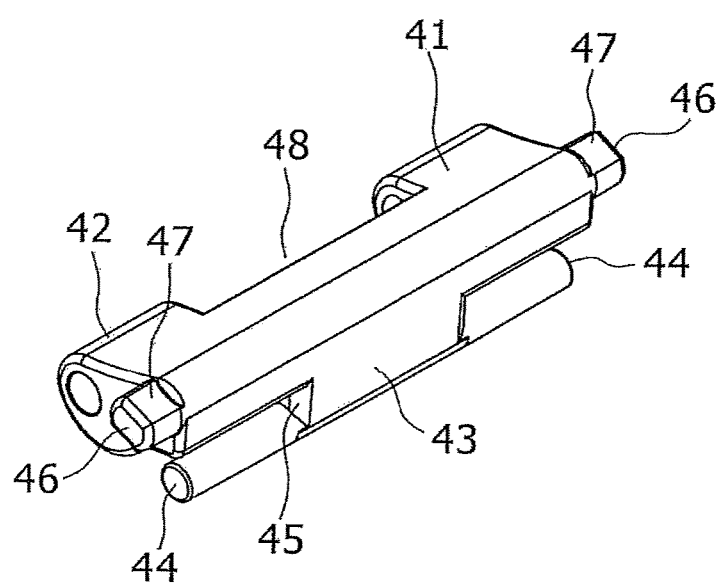
FIG. 16 A perspective view schematically showing the locking block in a fallen state in the embodiment of the substrate storage container according to the present invention.
Figure 17:
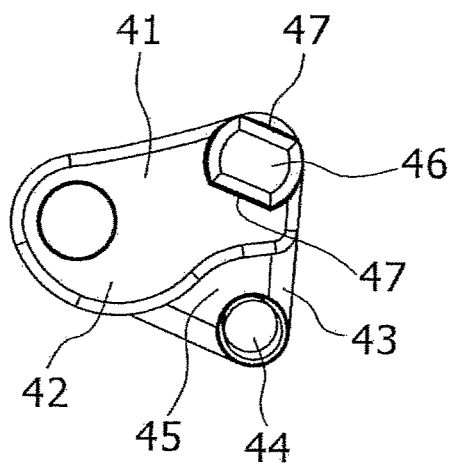
FIG. 17 A side view illustration schematically showing the locking block in the fallen state in the embodiment of the substrate storage container according to the present invention.
Figure 18:
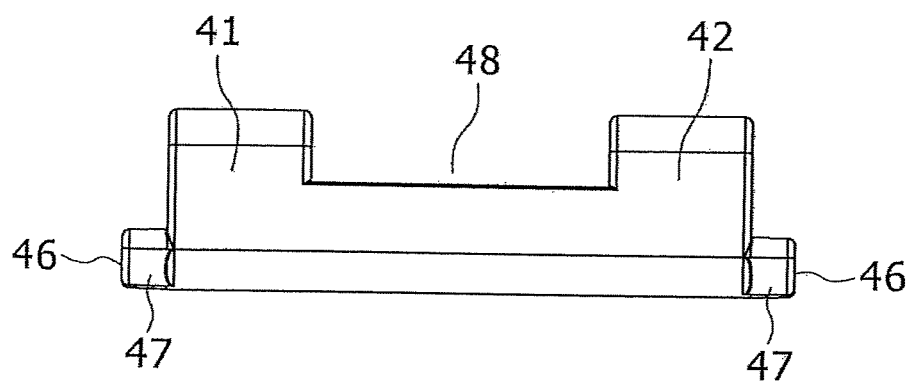
FIG. 18 A front view illustration schematically showing the locking block in the embodiment of the substrate storage container according to the present invention.
Figure 19:
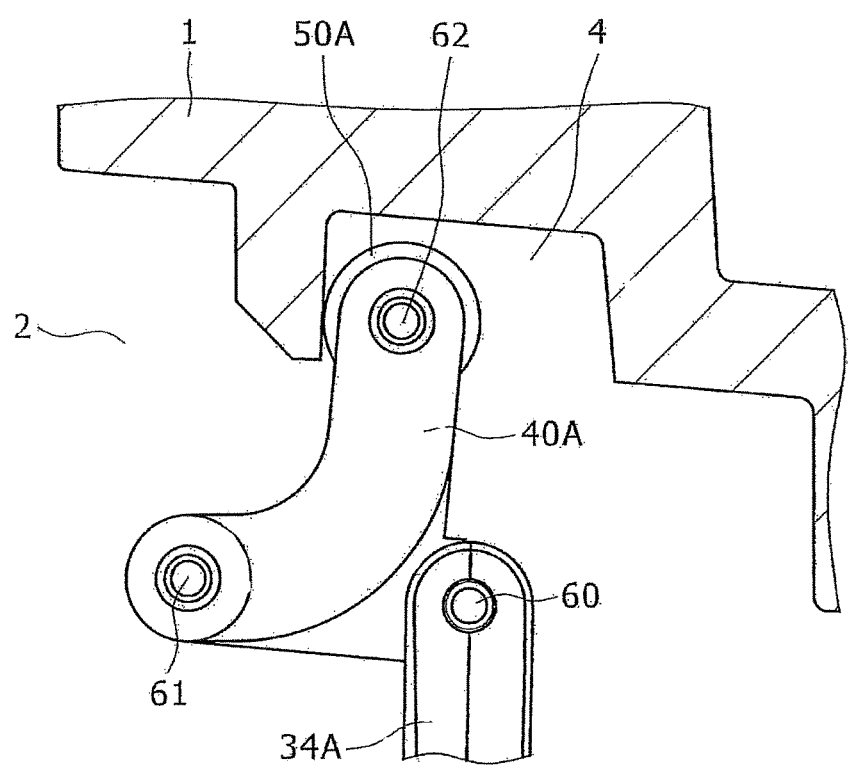
FIG. 19 A partial sectional illustration schematically showing the relationship between a container body of a conventional substrate storage container and a locking claw of a locking mechanism.

As shown in FIGS. 16 and 17, the locking block 41 has a substantially isosceles triangular shape when viewed from the side, including a laterally long plate part 42 with a bulging distal end part and a curved back surface, and a projection 43 located on the lid body 11 side and integrally formed with the middle part of the back surface of this plate part 42. The cylindrical joint bar 44 sticks out horizontally from both sides of the projection 43. The pair of joint bars 44 are fitted to, and swingably supported on, the pair of joint claws 39 of the advancing/retracting bar 34.

Gaps 45 for attaching the joint claws are created between the pair of joint bars 44 and the plate part 42. This gap 45 is adjusted to a size and length such that the joint claw 39 will not come off the joint bar, taking into account the thickness of the joint claw 39 of the advancing/retracting bar 34. From the viewpoint of achieving metal-free construction and improving strength and durability, each joint bar 44 is formed to have a diameter greater than that in the conventional example, specifically, a diameter of 1.5 mm or greater to 5.5 mm or less, preferably 2 mm or greater to 5 mm or less, and more preferably around 3 mm.

The plate part 42 of the locking block 41 has a pair of column-shaped cam bosses 46, which are horizontally protruded from both sides of the proximal end portion of the plate part 42, and which are located closer to the joint bar 44 than that of the conventional example. The pair of protruded cam bosses 46 are slidably fitted in the cam grooves 17 of the locking mechanism guide blocks 16, respectively. Each cam boss 46 is basically formed in a cylindrical shape. From the viewpoint of achieving metal-free construction and improving strength and durability, the cam boss 46 is formed to have a diameter greater than that in the conventional example, specifically, a diameter of 1.5 mm or greater to 5.5 mm or less, preferably 2 mm or greater to 5 mm or less, and more preferably around 4 mm. Formed on the peripheral surface of the cam boss 46 are a pair of parallel flat facets 47, 180° apart from each other so as to allow the locking claw 40 to move only linearly.

When the locking mechanism 30 locks the lid 10 fitted to the front 2 of the container body 1 and draws the lid 10 into the container body 1, the cam boss 46 is located on an extension line EL extended from the inner surface of a front wall 5 that defines the locking pocket 4 of the container body 1 while the joint bar 44 is positioned in the vicinity of the extension line extended from the inner surface of the rear wall that defines the locking pocket 4 (see FIG. 2).

A depressed portion 48 is formed to be recessed in the center of the distal end part of the plate part 42 of the locking block 41 while a resin pin 49 is horizontally and pivotally supported between the two side ends of the depressed portion 48. A cylindrical resin pressing roller 50 is disposed in the depressed portion 48 and rotatably fitted and supported through the resin pin 49. This resin pressing roller 50 functions so as to move in sliding contact with the interior of the locking pocket 4 of the container body 1. The molding material of the resin pin 49 and the resin pressing roller 50 is the same as that of the locking claw 40. From the viewpoint of putting a weight on wear resistance, the predetermined resin is preferably at least one of polyetheretherketone resin and polybutylene terephthalate resin. In addition to the predetermined resin, lightweight carbon having excellent strength and rigidity, specifically, carbon nanotubes, carbon fibers, etc., may be optionally added to the molding material.

From the viewpoint of achieving metal-free construction and improving strength and durability, the resin pin 49 is formed to have a diameter greater than that in the conventional example, specifically, a diameter of 1.5 mm or greater to 5.5 mm or less, preferably 2 mm or greater to 5 mm or less, and more preferably 3 mm or greater to 3.06 mm or less and is arranged closer to the cam boss 46 than that in the conventional example. In addition, in order to realize metal-free construction and improve strength and durability, the resin pressing roller 50 is formed to have an outside diameter greater than that in the conventional example, specifically, an outside diameter of 6 mm or greater to 7 mm or less, preferably around 6.55 mm, and an inside diameter of 3 mm or greater to 3.05 mm or less so as to allow the pressing roller 50 to come into rotating and sliding contact with the interior surface of the front wall 5 of the locking pocket 4 with suppressed generation of particles.

Herein, from the viewpoint of ensuring that the locking claw 40 fits into and becomes engaged with the locking pocket 4 regardless of the depth of the locking pocket 4 of the container body 1, and also as well as improving the smoothness of the operation, the locking claw 40 is required to perform a linear motion and then a swinging motion when the locking mechanism 30 locks and to perform a swing motion and then a linear motion when the locking mechanism 30 unlocks. In order to perform these movements, the cam groove 17 of each locking mechanism guide block 16 is formed in a combined shape of straight and circular contours.

Specifically, as shown in FIGS. 9 to 11, the cam groove 17 is formed of divided sections including a fitting start linear-motion groove 18 into which the cam boss 46 of the locking claw 40 is fitted; a straight linear-motion groove 19 formed contiguous to the end of the fitting start linear-motion groove 18 to guide the cam boss 46 while sliding the pair of flat facets 47 thereagainst, and an arcuate swinging-motion groove 20 formed wide at the end of the straight linear-motion groove 19. The fitting start linear-motion groove 18 is located near the operating reel 31 on the opposite side of the arcuate swinging-motion groove 20, and the arcuate swinging-motion groove 20 is located near the peripheral wall of the lid body 11.

The linear motion fitting start groove 18 is formed in a rectangular shape in the longitudinal direction (upward direction in FIG. 11) from the end of the locking mechanism guide block 16, and assists correct fit of the locking claw 40 at assembly by letting the pair of flat facets 47 of the cam boss 46 slide thereon to control the posture of the locking claw 40, thereby limiting the swing of the locking claw 40 with respect to the thickness direction of the lid body 11. The straight linear-motion groove 19 is formed in a rectangular shape with the same width as the fitting start linear-motion groove 18 and causes the locking claw 40 to move linearly by controlling the posture of the locking claw 40, thereby limiting the swing of the locking claw 40 with respect to the thickness direction of the lid body 11. On the other hand, the arcuate swinging-motion groove 20 is formed in a substantially circular shape with a larger diameter than the cam boss 46 to create clearance between itself and the pair of flat facets 47 of the cam boss 46 and functions to cause the locking claw 40 to swing by releasing the posture control of the locking claw 40.

In the above configuration, when the lid 10 fitted to the front 2 of the container body 1 is locked, the lid 10 is fitted first, then the operation key of the lid opening/closing device turns the operating reel 31 of each locking mechanism 30 by 90° in one direction. This rotation of the operating reel 31 causes each advancing/retracting bar 34 to advance from the reference position toward the peripheral wall of the lid body 11.

As the advancing/retracting bars 34 advance from the reference position toward the peripheral wall of the lid body 11, at the stage (see FIG. 3) in which the cam boss 46 is guided with the pair of flat facets 47 being in the sliding contact with the straight linear-motion groove 19 of the cam groove 17, each locking claw 40 linearly moves in the outward direction of the lid until the resin pressing roller 50 that has been partly exposed is fully exposed. At the stage in which clearance is created between the arcuate swinging-motion groove 20 of the cam groove 17 and the pair of flat facets 47 of the cam boss 46, each locking claw 40 becomes able to swing (see FIG. 4), and begins swinging in a direction from the lid body 11 side toward the cover plate 21 (see FIG. 5) so as to cause the resin pressing roller 50 to enter and become engaged with the interior of the locking pocket 4 of the container body 1 (see FIG. 2).

During this process, the locking claw 40 does not move in the outward direction of the lid while swinging, but instead moves linearly toward the deepest part 6 of the locking pocket 4 of the container body 1 and then swings. Therefore, the range of swing motion of the locking claw 40 can be minimized, and the locking claw 40 can be appropriately fitted into and engaged with the deepest part 6 of the locking pocket 4.

Thanks to the thus achieved fitting and engagement of the locking claws 40, the lid 10 can be locked as being accurately drawn and press-fitted to a specified position in the front of the container body 1 with the cover plates 21 aligned with the front 2 of the container body 1. During this process of being drawn in, the cam boss 46 fits in the arcuate swinging-motion groove 20 of the cam groove 17 and is positioned on the extension line EL extended from the inner surface of the front wall 5 that defines the lock pocket 4 of the container body 1. In other words, the cam boss 46 is located on the outer side inside the lid body at the contact point between the inner surface of the front wall 5 that defines the locking pocket 4 and the resin pressing roller 50, so that the force acting in the left-right direction of the locking pocket 4 (interior direction in FIG. 2) can be easily transmitted, thus making it possible to reduce the loss of the drawing force.

In contrast to the case where the lid 10 is locked, when the lid 10 is removed from the front 2 of the container body 1 by unlocking the locking mechanism 30, the operation key of the lid opening/closing device turns the operating reel 31 of each locking mechanism 30 by 90° in the opposite direction. This rotation of reel the operating 31 causes each advancing/retracting bar 34 to retract and return from the advanced position to the original reference position.

As the advancing/retracting bars 34 retreat and return from the advanced position to the original reference position, at the stage in which clearance is created between the arcuate swinging-motion groove 20 of the cam groove 17 and the pair of flat facets 47 of the cam boss 46, each locking claw 40 swings and returns from the cover plate 21 side to the lid body 11 side to release the resin pressing roller 50 from the locking pocket 4 of the container body 1. At the stage in which the cam boss 46 is guided with the pair of flat facets 47 being in the sliding contact with the straight linear-motion groove 19 of the cam groove 17, each locking claw 40 linearly moves toward the passage opening 12 of the lid 10 and retracts part of the fully exposed resin pressing roller 50 into the passage hole 12.

During this process, the locking claw 40 does not retract into the interior of the lid 10 while swinging, but instead moves linearly after swinging. Therefore, the range of swing motion of the locking claw 40 can be minimized, and the retracting operation of the locking claw 40 can be made smoother. As the locking claws 40 return in this manner, the lid 10 fitted to the front 2 of the container body 1 becomes able to be removed, and the lid 10 is pulled out and removed from the front 2 of the container body 1 by the lid opening/closing device.

According to the above, since the locking claw 40 can be made metal-free, diverse adverse effects on the semiconductor wafers stored in the container body 1 can be eliminated. Furthermore, since the joint bar 44, cam boss 46, resin pin 49, and resin pressing roller 50 of the locking claw 40 can be made thicker, sufficient strength and durability can be ensured, hence the fear of breakage of the joint bar 44, cam boss 46 and resin pin 49 can be eliminated. Also, since a pair of joint bars 44 and cam bosses 46 are used instead of a single long joint bar 44 and a cam boss 46, it is possible to mold these parts short to avoid the occurrence of sink marks during molding.

Furthermore, by reducing the swinging range of the locking claw 40, the center of swing of the locking claw 40 can be set closer to the lid body side than in the conventional example, so that the center of swing of the locking claw 40 can be positioned around above and below the contact point between the locking pocket 4 and the resin pressing roller 50. This change in position can prevent loss of drawing force at the time of locking.

Furthermore, since the locking claw 40 moves linearly first, then swings during a locking process, the locking claw 40 can be fitted in and become engaged with the deepest part 6 of the locking pocket 4 even if the locking pocket 4 of the container body 1 is deep. As a result, it is possible to prevent insufficient engagement of the locking claw 40 with the locking pocket 4 of the container body 1, hence prevent the semiconductor wafers in the container body 1 from being polluted due to deterioration of sealability of the lid 10. Thus, it is possible to highly expect prevention of degradation of the quality of semiconductor wafers. In addition, since it is not necessary to intentionally form the locking pocket 4 deeply, it is possible to improve the design flexibility of the container body 1.

Furthermore, since the locking claw 40 moves linearly after swinging when unlocking, it is possible to prevent the protruding locking claw 40 and the resin pressing roller 50 from being hindered to return. Moreover, since the joint bar 44 of the locking block 41 and the cam boss 46 are disposed close to each other and the joint bar 44 and the resin pressing roller 50 are also arranged close to each other, the locking claw 40 can be made compact with its operating range reduced, which facilitates transmission of force. Further, since the same cam boss 46 is fitted into the straight linear-motion groove 19 and the arcuate swinging-motion groove 20 of the cam groove 17, instead of fitting separate cam bosses 46 into them, the length of the cam groove 17 can be shortened.

In addition, in the above embodiment, a robotic flange for ceiling transportation may be removably attached to the center of the top face of the container body 1 while an operating handles for gripping may be removably attached to the outer surface of each side wall of the container body 1. Though in the above embodiment, the surface of the lid body 11 is covered with a pair of cover plates 21, it may be covered with a single cover plate 21. Further, though in the above embodiment, the cam groove 17 for the locking mechanism 30 is cut out on the opposing surfaces of the locking mechanism guide blocks 16, the present invention should not be limited to this. For example, a holder having a flat and substantially rectangular prism shape may be fitted to the distal end part of each advancing/retracting bar 34 and the locking claw 40, and the both side walls of the holder may be used as guide members for the locking mechanism. Additionally, the fitting start linear-motion groove 18 of the cam groove 17 may be omitted, and the cam groove 17 may be formed of divided parts, i.e., the straight linear-motion groove 19 and the arcuate swinging-motion groove 20.

Furthermore, a required number of reinforcing ribs 37 may be formed on the front surface or rear surface of the advancing/retracting bar 34. Further, if necessary, a required number of reinforcing ribs 37 may be brought into sliding contact with the mounting section 13 and/or cover plate 21 of the lid body 11, so that the advancing/retracting bar 34 can advance and retract smoothly without leaning in the thickness direction of the lid 10. Though in the above embodiment, the resin pin 49 is installed and fixed between both sides of the depressed portion 48 of the locking block 41, the resin pin 49 can be installed rotatably. Furthermore, a pair of steps may be cut out on the peripheral surface of the resin pin 49 near both ends of the resin pressing roller 50, but the invention should not be particularly limited, or provision of steps on the peripheral side is not a must.

INDUSTRIAL APPLICABILITY

The substrate storage container according to the present invention is used in the manufacturing fields of electricity, electronics, precision equipment, semiconductors, etc.

DESCRIPTION OF REFERENCE NUMERALS 1 container body
2 front (opening portion)
4 locking pocket
5 front wall
6 deepest part
10 lid
11 lid body
12 passage opening
13 mounting section
14 door guide sleeve (door guide)
14A rotation limiting sleeve
16 locking mechanism guide block (locking mechanism guide member)
17 cam groove
18 fitting start linear-motion groove
19 straight linear-motion groove 19
20 arcuate swinging-motion groove 20
21 cover plate
30 locking mechanism
31 operating reel (operating member)
34 advancing/retracting bar (advancing/retracting member)
37 reinforcing rib
39 joint claw
40 locking claw
41 locking block
42 plate part
43 projection
44 joint bar
45 gap
46 cam boss (cam protrusion)
47 flat facet
48 depressed portion
49 resin pin
50 resin pressing roller (resin roller)
EL extension line

The invention claimed is:

1. A substrate storage container comprising:
a lid that is fitted to an opening portion of a container body capable of storing substrates; and
a locking mechanism that locks the fitted lid,
wherein
the lid comprises:
    a lid body that is fitted to the opening portion of the container body; and
    a plurality of locking mechanism guide members attached to the lid body,
    wherein
        a peripheral part of the lid body is formed with a plurality of passage openings capable of facing to locking pockets on an inner circumference of the opening portion of the container body, and
        the plurality of locking mechanism guide members are arranged opposite to each other with each of opposite surfaces formed with a cam groove,
the locking mechanism comprises:
    a plurality of advancing/retracting members that move in an inside-outside direction of the lid body as an operating member supported on the lid body of the lid is turned; and
    a plurality of locking claws which protrude from the passage openings of the lid body fit into the locking pockets of the container body when the advancing/retracting members are advanced, and return from the locking pockets of the container body into the passage openings of the lid body when the advancing/retracting members are retracted,
the locking claw comprises:
    a locking block that can move linearly in the inside-outside direction of the lid body while being held between the plurality of locking mechanism guide members of the lid, and can swing in a thickness direction of the lid body;
    a plurality of joint bars that stick out of the locking block, and are joined to the advancing/retracting member of the locking mechanism; and
    a plurality of cam protrusions that stick out from the locking block, and are fitted into the cam grooves of the plurality of locking mechanism guide blocks,
    wherein
    the locking block, the plural joint bars and the plurality of cam protrusions are formed integrally from a molding material containing a predetermined resin,
    a resin pin is supported between the both sides of a depressed portion formed in the locking block, a resin roller is fitted on the resin pin so as to come into contact with an interior of the locking pocket of the container body, and a peripheral surface of the cam protrusion has a plurality of flat facets formed a predetermined interval apart from each other, and the cam groove of the locking mechanism guide member is formed of divided sections including:

a straight linear-motion groove that is in contact with the plurality of flat facets of the cam protrusion of the locking claw to limit a swing of the locking claw; and an arcuate swinging-motion groove formed wide at one end of the straight linear-motion groove to permit the swing of the locking claw.

2. The substrate storage container according to claim 1, wherein the container body is formed to be a front open box capable of accommodating a plurality of semiconductor wafers so as to enable the lid to be removably fitted to the opened front, the plurality of locking mechanism guide members are attached in a vicinity of the peripheral part of the lid body of the lid, and the locking mechanism guide member that, among the plurality of locking mechanism guide members, is located close to a lateral side of the lid body, is integrated with a door guide.

3. The substrate storage container according to claim 2, wherein the cam protrusion of the locking claw is adapted to be located in a vicinity of an extension line extended from an inner surface of a front wall that defines the locking pocket of the container body when the locking mechanism locks the lid fitted to the front of the container body and draws the lid into the container body.

4. The substrate storage container according to claim 1, wherein the lid body of the lid is formed with a pair of mounting sections for mounting locking mechanisms on both sides on a front surface of the lid body, and is formed with a cover plate for covering the locking mechanism of the lid body, the advancing/retracting member for the locking mechanism is bent in a thickness direction of the lid, and the advancing/retracting member is formed with a reinforcing rib formed on at least one of a front surface and a rear surface of the advancing/retracting member.

5. The substrate storage container according to claim 1, wherein a plurality of joint claws having a semicircular arc cross-section are formed on both sides at a distal end part of the advancing/retracting member of the locking mechanism so that the plurality of joint claws and the plurality of joint bars of the locking claw are fitted together.

6. The substrate storage container according to claim 5, wherein the locking block comprises:

a plate part with a bulging distal end part and a curved back surface; and a projection formed on the back surface of the plate part, and the locking block is formed to have a substantially triangular shape when viewed from a lateral side, and the joint bar sticks out from each lateral side of the projection so as to create a gap for the joint claws between the joint bar and the plate part.

7. The substrate storage container according to claim 6, wherein the plate part of the locking block has a pair of cam protrusions which are protruded, in a vicinity of the joint bars, from both sides of a proximal end portion of the plate part, and the plate part has the depressed portion formed in a distal end part of the plate part, and the plate part has the resin pin supported between the two side ends of the depressed portion in a vicinity of the cam protrusions.

8. The substrate storage container according to claim 1, wherein in the cam groove a fitting start linear-motion groove into which the cam protrusion of the locking claw is fitted is formed contiguous to one end of the straight linear-motion groove, on an opposite side of the arcuate swinging-motion groove, and the plurality of flat facets of the cam projection are put in contact with the fitting start linear-motion groove to limit the swing of the locking claw.

* * * * *